United States Patent [19]
Yang et al.

[11] Patent Number: 6,060,348
[45] Date of Patent: May 9, 2000

[54] METHOD TO FABRICATE ISOLATION BY COMBINING LOCOS AND SHALLOW TRENCH ISOLATION FOR ULSI TECHNOLOGY

[75] Inventors: Fu-Liang Yang, Tainan; Wei-Ray Lin, Yi-Lan; Ming-Hong Kuo, Ping-Tung; Erik S. Jeng, Hsinchu, all of Taiwan

[73] Assignee: Vanguard International Semiconducter Corporation, Hsin-Chu, Taiwan

[21] Appl. No.: 09/184,341

[22] Filed: Nov. 2, 1998

[51] Int. Cl.[7] .................. H01L 21/8238; H01L 21/76
[52] U.S. Cl. .............. 438/227; 438/229; 438/230; 438/424; 438/425; 438/443
[58] Field of Search ................. 438/424, 425, 438/443

[56] References Cited

U.S. PATENT DOCUMENTS

| | | |
|---|---|---|
| 4,842,675 | 6/1989 | Chapman et al. . |
| 5,350,941 | 9/1994 | Madan ........................... 257/647 |
| 5,411,913 | 5/1995 | Bashir et al. ..................... 437/67 |
| 5,498,566 | 3/1996 | Lee . |
| 5,679,599 | 10/1997 | Mehta ............................. 437/69 |
| 5,683,932 | 11/1997 | Bashir et al. ..................... 437/67 |
| 5,696,021 | 12/1997 | Chan et al. ...................... 437/72 |
| 5,712,205 | 1/1998 | Park et al. . |

Primary Examiner—John F. Niebling
Assistant Examiner—Ron Pompey
Attorney, Agent, or Firm—George O. Saile; Stephen B. Ackerman; Rosemary L.S. Pike

[57] ABSTRACT

A method for forming planarized isolation by combining LOCOS and STI isolation processes is described. A first nitride layer is deposited over a pad oxide layer on the surface of a semiconductor substrate. The first nitride layer and pad oxide layer are etched through where they are not covered by a mask to provide openings where the surface of the semiconductor substrate is exposed wherein there is at least one wide opening and one narrow opening. A second nitride layer is deposited over the substrate and etched back to leave spacers on the sidewalls of the openings wherein the narrow opening is filled by the spacers. The exposed semiconductor substrate within the wide opening is oxidized wherein a field oxide region is formed within the wide opening. A portion of the first nitride layer and spacers is etched away whereby the semiconductor substrate within the narrow opening is exposed. A trench is etched into the semiconductor substrate where it is exposed within the narrow opening. An oxide layer is deposited overlying the first nitride layer and field oxide region and filling the trench wherein the oxide layer filling the trench forms a shallow trench isolation region. The oxide layer is polished away with a polish stop at the first nitride layer. The first nitride layer, the spacers, and the pad oxide layer are removed, completing formation of both a field oxide region and a shallow trench isolation region in the fabrication of an integrated circuit device.

20 Claims, 7 Drawing Sheets

METHOD TO FABRICATE ISOLATION BY COMBINING LOCOS AND SHALLOW TRENCH ISOLATION FOR ULSI TECHNOLOGY

BACKGROUND OF THE INVENTION (1) Field of the Invention

The present invention relates to the fabrication of integrated circuit devices, and more particularly, to a method of forming planarized isolation that combines local oxidation of silicon (LOCOS) and shallow trench isolation (STI) in the fabrication of integrated circuits.

(2) Description of the Prior Art

As device technology is scaled down to the quarter micron regime, the use of the conventional local oxidation of silicon (LOCOS) isolation will be confined by smaller channel-width encroachment (bird's beak). Shallow trench isolation (STI) can be used to eliminate these encroachments, especially in ultra large scale integrated (ULSI) circuit devices. To achieve good planarity after STI, chemical mechanical polishing (CMP) is often used. However, due to pad deformation, the trench open area is susceptible to dishing which causes oxide thinning in the wide trench.

FIG. 1 illustrates a partially completed integrated circuit device of the prior art. A pad oxide layer 12 has been grown or deposited over the surface of a semiconductor substrate 10. A silicon nitride layer 14 is deposited over the pad oxide layer. Trenches in the substrate have been filled with an oxide 17. Referring to FIG. 2, the oxide 17 is polished using CMP. Oxide dishing and the resulting lack of oxide uniformity can both be seen in wide area 19.

A combination of LOCOS in the wide areas and STI in the narrow areas may be used to resolve these problems. Various combinations of LOCOS and STI have been proposed in the art. U.S. Pat. No. 5,679,599 to Mehta teaches etching a deep trench and filling it with oxide, then using field oxidation both to form a LOCOS region and to smooth out the trench isolation region. U.S. Pat. No. 5,696,021 to Chan et al forms a FOX region which is then partially etched away. Trenches are etched at the edges of the FOX region which are then filled with further field oxidation. U.S. Pat. Nos. 5,683,932 and 5,411,913 both to Bashir et al disclose filling trenches with a oxide or polysilicon and etching back to planarize the surface while covering the surface in the wide areas with a photoresist mask. U.S. Pat. No. 5,350,941 to Madan teaches forming FOX regions, then etching through the FOX to form deep trenches of uniform width. The trenches can then be filled with oxide or polysilicon.

SUMMARY OF THE INVENTION

Accordingly, the primary object of the invention is to provide a process for forming planarized isolation in the fabrication of integrated circuits.

A further object of the invention is to provide a process for forming planarized isolation in which oxide dishing is eliminated.

Still another object is to provide a process for forming planarized isolation by combining LOCOS and STI isolation processes.

Yet another object of the invention is to provide a process for forming planarized isolation by using LOCOS in the wide areas and STI in the narrow areas.

In accordance with the objects of the invention, a method for forming planarized isolation by combining LOCOS and STI isolation processes is achieved. A pad oxide layer is deposited on the surface of a semiconductor substrate. A first nitride layer is deposited overlying the pad oxide layer. The first nitride layer and pad oxide layer are etched through where they are not covered by a mask to provide openings where the surface of the semiconductor substrate is exposed wherein there is at least one wide opening and at least one narrow opening. A second nitride layer is deposited over the first nitride layer and within the openings and etched back to leave spacers on the sidewalls of the openings wherein the narrow opening is filled by the spacers. The exposed semiconductor substrate within the wide opening is oxidized wherein a field oxide region is formed within the wide opening. A portion of the first nitride layer and spacers is etched away whereby the semiconductor substrate within the narrow opening is exposed. A trench is etched into the semiconductor substrate where it is exposed within the narrow opening. An oxide layer is deposited overlying the first nitride layer and field oxide region and filling the trench wherein the oxide layer filling the trench forms a shallow trench isolation region. The oxide layer is polished away with a polish stop at the first nitride layer. The first nitride layer, the spacers, and the pad oxide layer are removed, completing formation of both a field oxide region and a shallow trench isolation region in the fabrication of an integrated circuit device.

BRIEF DESCRIPTION OF THE DRAWINGS

In the accompanying drawings forming a material part of this description, there is shown.

DESCRIPTION OF THE PREFERRED EMBODIMENTS

Figure 1:
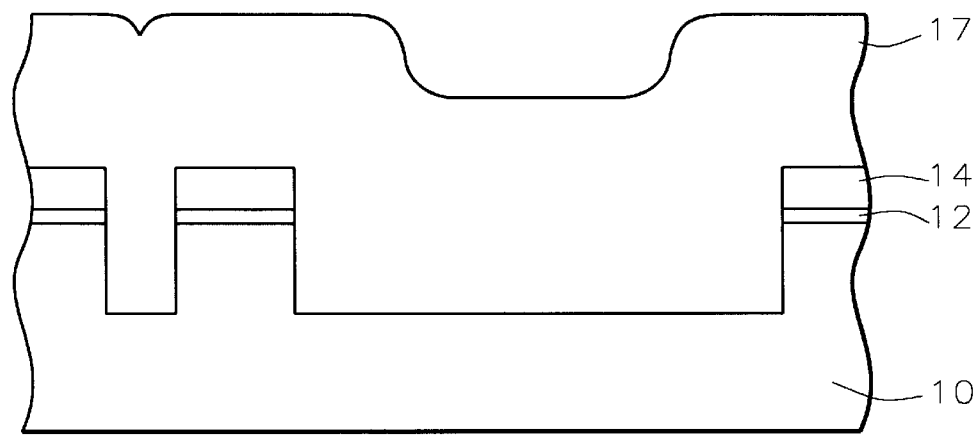
FIGS. 1 and 2 are cross-sectional representations of an embodiment of the prior art.
Figure 2:
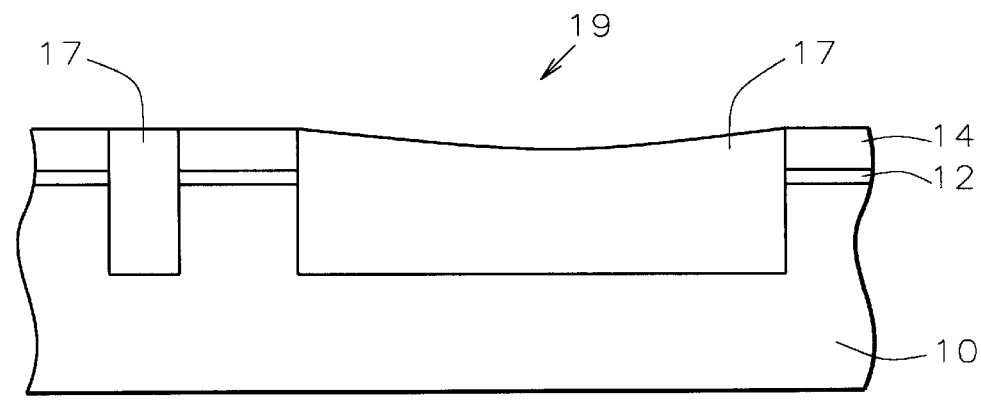
Figure 3:
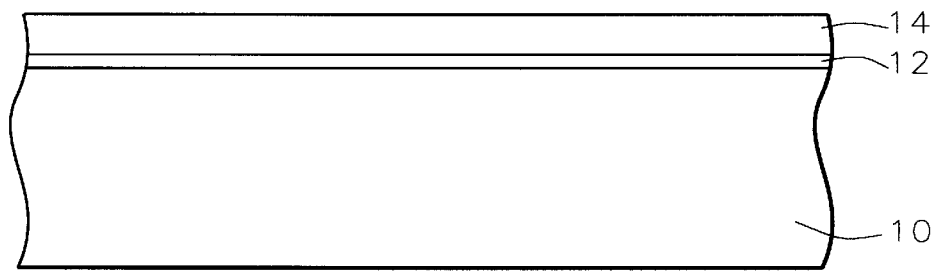
FIGS. 3 through 12 are cross-sectional representations of a preferred embodiment of the present invention.

Referring now more particularly to FIG. 3, there is shown a semiconductor substrate 10. A layer of pad silicon oxide 12 is grown on the surface of the semiconductor substrate to a thickness of between about 50 and 500 Angstroms. A layer of silicon nitride 14 is deposited over the pad oxide layer 12 to a thickness of between about 1000 and 3000 Angstroms.

Figure 4:
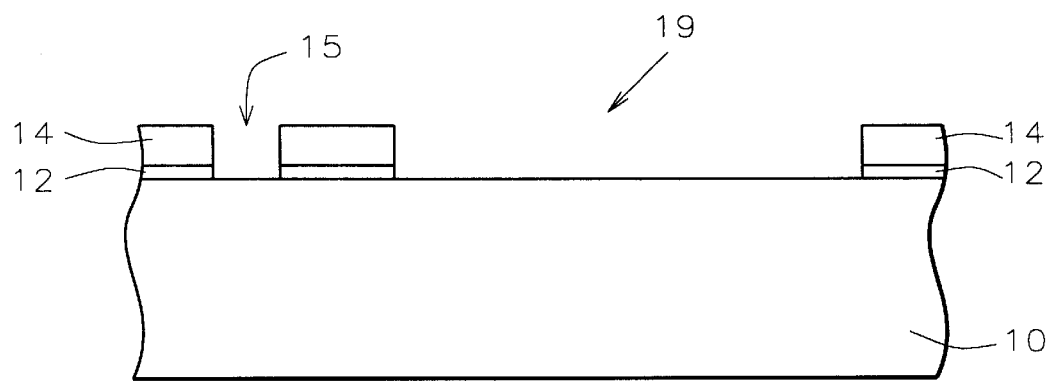

Referring now to FIG. 4, a photoresist mask, not shown, is formed over the surface of the nitride layer wherein openings are left where the isolation regions are to be formed. Using conventional photolithography and etching techniques, the nitride and pad oxide layers are etched to expose the semiconductor substrate where the isolation regions are to be formed. These isolation regions include narrow regions such as 15 and wide regions such as 19. The narrow regions may be less than about 0.2 microns in width and the wide regions may be more than about 0.3 microns in width.

Figure 5:
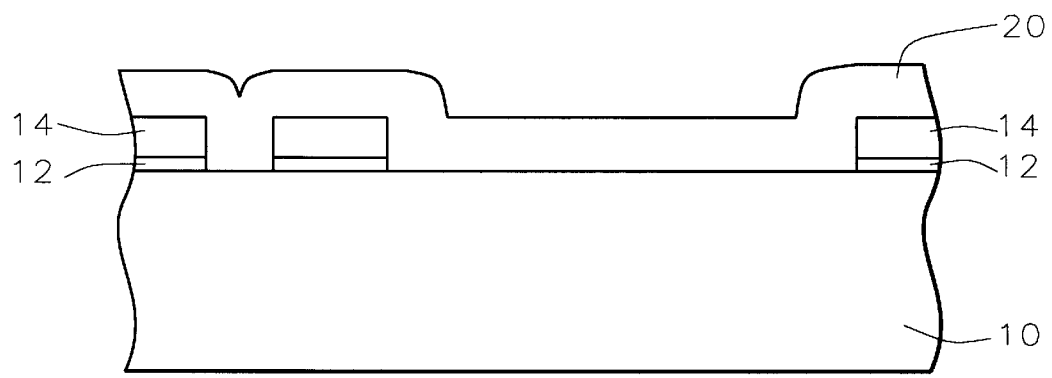

Referring now to FIG. 5, a silicon nitride layer 20 is deposited by chemical vapor deposition (CVD) to a thickness of between about 500 and 2000 Angstroms over the surface of the substrate.

Figure 6:
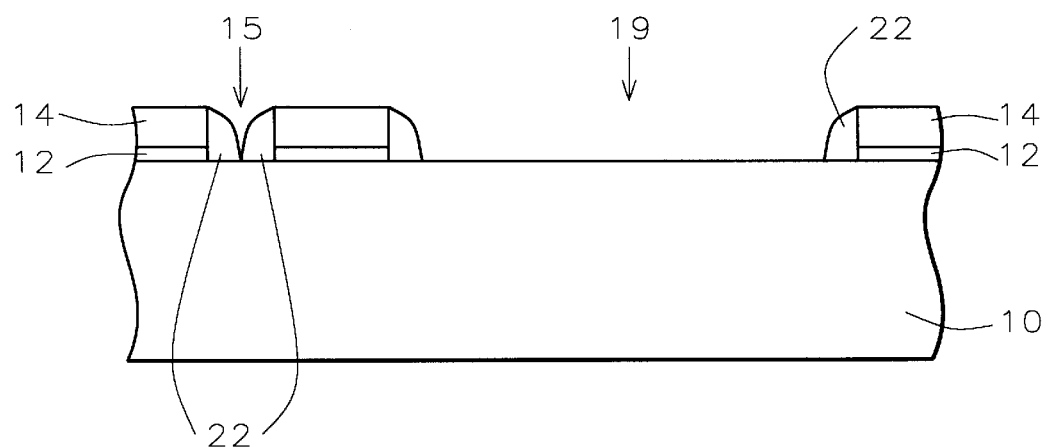

The silicon nitride layer is anisotropically etched back to left silicon nitride spacers 22 on the sidewalls of the openings 15 and 19, as shown in FIG. 6. The spacers completely cover the semiconductor substrate within the narrow opening 15. The silicon nitride spacers 22 have a width of between about 500 and 2000 Angstroms.

Figure 7:
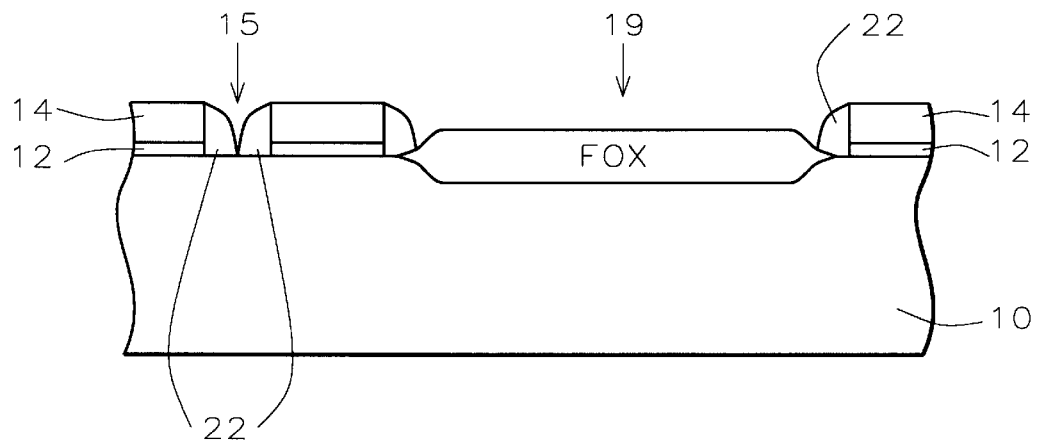

Next, field oxidation is performed, using conventional field oxidation conditions. Field OXide region FOX 26 is formed in the wide area 19, as illustrated in FIG. 7. Since the semiconductor substrate within the narrow opening 15 is covered by the silicon nitride spacers 22, no field oxidation takes place in the narrow opening.

Figure 8:
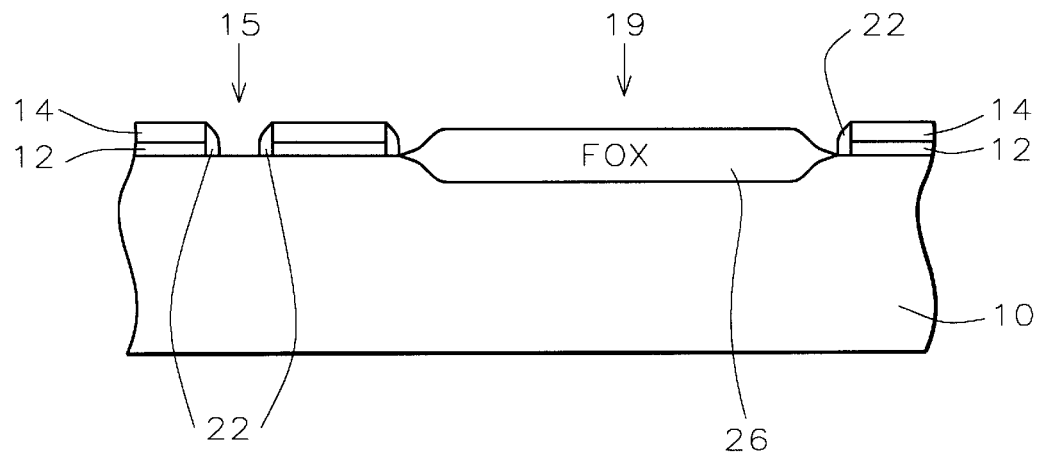

Now, the nitride layer 14 and nitride spacers 22 are partially etched away using, for example, hot H3PO4 or dry etching that is highly selective to nitride with respect to oxide and silicon. The resulting structure is shown in FIG. 8.

Figure 9:
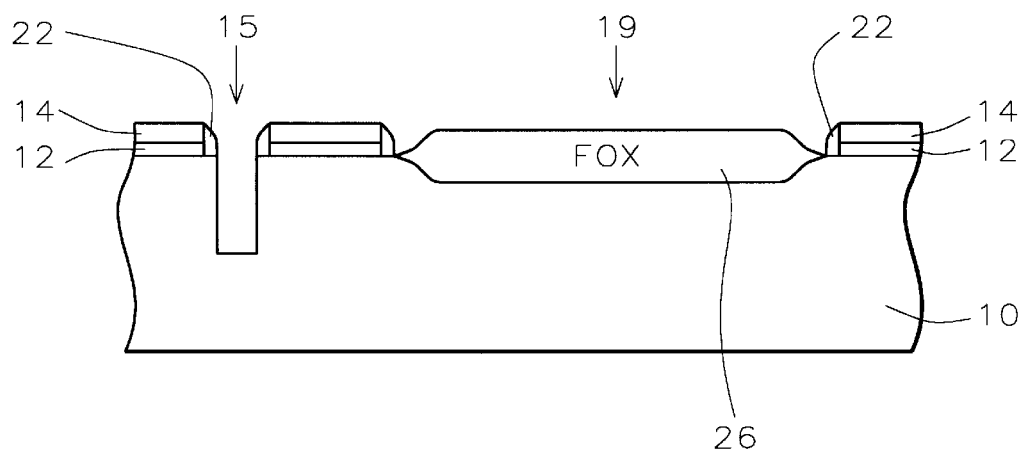

Now, referring to FIG. 9, the semiconductor substrate exposed within the narrow opening 15 is etched into to a depth of between about 2000 and 10,000 Angstroms to form a trench.

Figure 10:
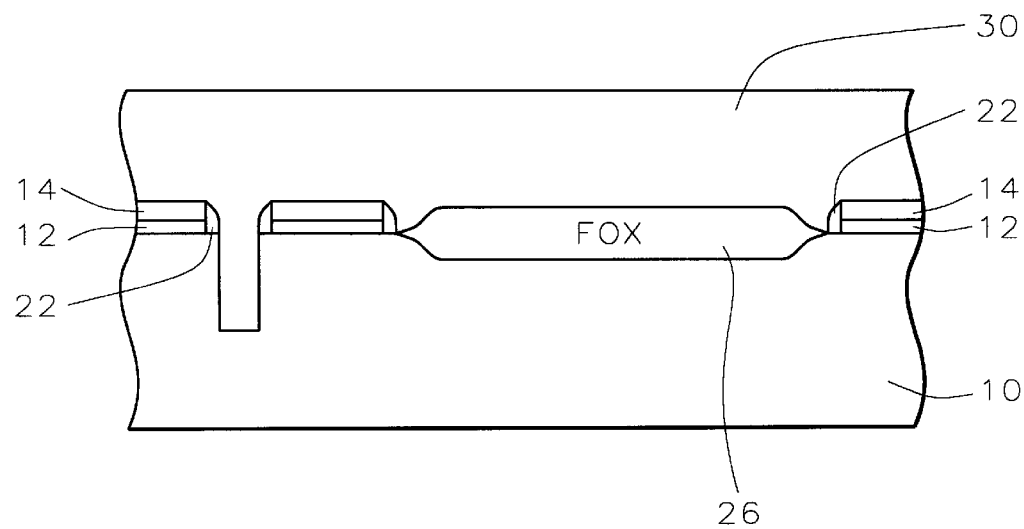

Referring now to FIG. 10, an oxide layer 30 is deposited by CVD over the surface of the substrate and filling the trench. The oxide layer 30 has a thickness of between about 3000 and 15,000 Angstroms.

Figure 11:
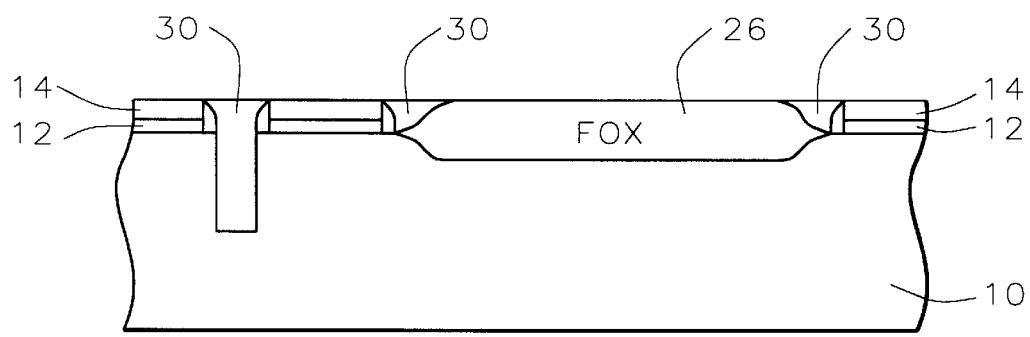

The oxide layer 30 is now polished using CMP with a polish stop at the nitride layer 14, as illustrated in FIG. 11.

Dishing over the wide trench is eliminated because of the presence of the field oxide region 26. Since the field oxide region 26 fills the wide trench, there is no dishing.

Figure 12:
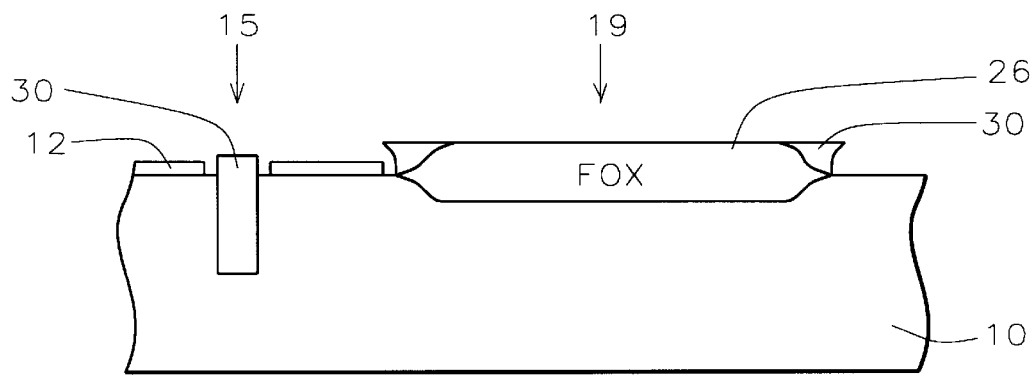

Finally, referring to FIG. 12, the silicon nitride layer and spacers 14 and 22, respectively, are removed using a conventional wet etch. Next, the pad oxide 12 and the oxide 30 at the edges of the field oxide region are also removed completing the formation of isolation regions; that is, shallow trench isolation 30 in the narrow area 15 and LOCOS 26 in the wide area 19.

Figure 13:
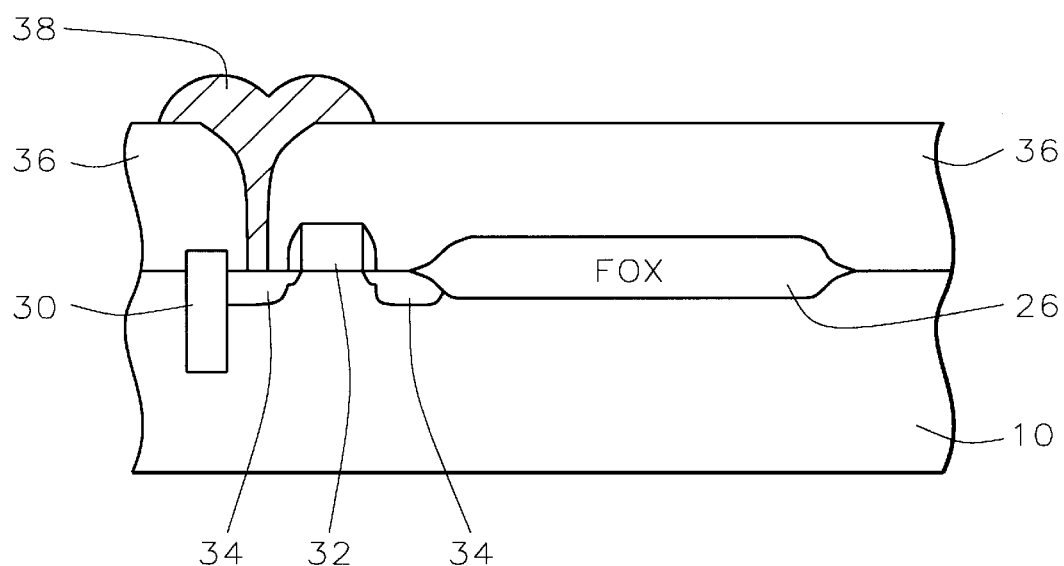
FIG. 13 is a cross-sectional representation of a completed integrated circuit device fabricated by the process of the present invention.

Processing continues as is conventional in the art. For example, semiconductor device structures, including gate electrodes 32 and source and drain regions 34 may be formed in the active regions between isolation regions as is conventional in the art. Electrical contacts 38 may be made through dielectric isolation layer 36, as shown in FIG. 13.

The process of the present invention results in the formation of planarized isolation by combining shallow trench isolation (STI) in narrow areas and local oxidation of silicon (LOCOS) in wide areas. The use of STI in the narrow areas prevents shortened channel length caused by bird's beak encroachment of LOCOS and the use of LOCOS in the wide areas eliminates the dishing caused by planarization of STI in the wide areas.

While the invention has been particularly shown and described with reference to the preferred embodiments thereof, it will be understood by those skilled in the art that various changes in form and details may be made without departing from the spirit and scope of the invention.

What is claimed is:

1. A method of forming both a field oxide region and a shallow trench isolation region in the fabrication of an integrated circuit device comprising:

depositing a pad oxide layer on the surface of a semiconductor substrate;

depositing a first nitride layer overlying said pad oxide layer;

etching through said first nitride layer and said pad oxide layer where they are not covered by a mask to provide openings wherein the surface of said semiconductor substrate is exposed wherein there is at least one wide opening and at least one narrow opening;

depositing a second nitride layer over said first nitride layer and within said openings;

etching back said second nitride layer to leave spacers on the sidewalls of said openings wherein said narrow opening is filled by said spacers;

oxidizing said exposed semiconductor substrate within said wide opening wherein a field oxidation region is formed within said wide opening;

etching away a portion of said first nitride layer and said spacers whereby said semiconductor substrate within said narrow opening is exposed;

etching a trench into said semiconductor substrate where it is exposed within said narrow opening;

depositing an oxide layer overlying said first nitride layer and said field oxide region and filling said trench wherein said oxide layer filling said trench forms a shallow trench isolation region;

polishing away said oxide layer with a polish stop at said first nitride layer; and removing said first nitride layer, said spacers, and said pad oxide layer completing said formation of both said field oxide region and said shallow trench isolation region in said fabrication of said integrated circuit device.

2. The method according to claim 1 wherein said pad oxide layer has a thickness of between about 50 and 500 Angstroms.

3. The method according to claim 1 wherein said first nitride layer is deposited to a thickness of between about 1000 and 3000 Angstroms.

4. The method according to claim 1 wherein said narrow opening has a width of between about 0.1 and 0.3 microns and wherein said wide opening has a width greater than about 0.3 microns.

5. The method according to claim 1 wherein said second nitride layer is deposited to a thickness of between about 500 and 2000 Angstroms.

6. The method according to claim 1 wherein said spacers have a width of between about 500 and 2000 Angstroms.

7. The method according to claim 1 wherein said trench has a depth of between about 2000 and 10,000 Angstroms.

8. The method according to claim 1 wherein said step of etching away a portion of said first nitride layer and said spacers comprises using hot H3PO4.

9. The method according to claim 1 wherein said step of etching away a portion of said first nitride layer and said spacers comprises using a dry etching step.

10. The method according to claim 1 wherein said oxide layer is deposited by low pressure chemical vapor deposition to a thickness of between about 3000 and 15,000 Angstroms.

11. The method according to claim 1 wherein said oxide layer is deposited by plasma enhanced chemical vapor deposition to a thickness of between about 3000 and 15,000 Angstroms.

12. The method according to claim 1 wherein said step of polishing away said oxide layer comprises chemical mechanical polishing (CMP).

13. The method according to claim 1 further comprising fabricating semiconductor device structures in and on said semiconductor substrate between said isolation trenches.

14. A method of forming both a field oxide region and a shallow trench isolation region in the fabrication of an integrated circuit device comprising:

depositing a pad oxide layer on the surface of a semiconductor substrate;

depositing a first nitride layer overlying said pad oxide layer;

etching through said first nitride layer and said pad oxide layer where they are not covered by a mask to provide openings wherein the surface of said semiconductor substrate is exposed wherein there is at least one wide opening having a width of greater than about 0.3 microns and at least one narrow opening having a width of less than about 0.3 microns;

depositing a second nitride layer over said first nitride layer and within said openings;

etching back said second nitride layer to leave spacers on the sidewalls of said openings wherein said spacers have a width of between about 500 and 2000 Angstroms and wherein said narrow opening is filled by said spacers;

oxidizing said exposed semiconductor substrate within said wide opening wherein a field oxidation region is formed within said wide opening;

etching away a portion of said first nitride layer and said spacers whereby said semiconductor substrate within said narrow opening is exposed;

etching a trench into said semiconductor substrate where it is exposed within said narrow opening;

depositing an oxide layer overlying said first nitride layer and said field oxide region and filling said trench wherein said oxide layer filling said trench forms a shallow trench isolation region;

polishing away said oxide layer with a polish stop at said first nitride layer; and removing said first nitride layer, said spacers, and said pad oxide layer completing said formation of both said field oxide region and said shallow trench isolation region in said fabrication of said integrated circuit device.

15. The method according to claim 14 wherein said second nitride layer is deposited to a thickness of between about 500 and 2000 Angstroms.

16. The method according to claim 14 wherein said trench has a depth of between about 2000 and 10,000 Angstroms.

17. The method according to claim 14 wherein said step of etching away a portion of said first nitride layer and said spacers comprises using hot H3PO4.

18. The method according to claim 14 wherein said step of etching away a portion of said first nitride layer and said spacers comprises using a dry etching step.

19. The method according to claim 14 wherein said step of polishing away said oxide layer comprises chemical mechanical polishing (CMP).

20. The method according to claim 14 further comprising fabricating semiconductor device structures in and on said semiconductor substrate between said isolation trenches.

* * * * *